United States Patent
Tamminen et al.

(10) Patent No.: US 7,647,044 B2
(45) Date of Patent: Jan. 12, 2010

(54) RF SWITCHING DEVICE

(75) Inventors: Brian Tamminen, Chaska, MN (US); Todd Loeffelholz, Minnetonka, MN (US)

(73) Assignee: ATX Networks Corp., Ajax, Ontario (CA)

( * ) Notice: Subject to any disclaimer, the term of this patent is extended or adjusted under 35 U.S.C. 154(b) by 420 days.

(21) Appl. No.: 11/507,873

(22) Filed: Aug. 21, 2006

(65) Prior Publication Data

US 2007/0195492 A1      Aug. 23, 2007

Related U.S. Application Data

(60) Provisional application No. 60/710,955, filed on Aug. 24, 2005.

(51) Int. Cl.
*H04Q 7/20* (2006.01)
(52) U.S. Cl. .................. 455/424; 455/425; 455/423; 455/226.4; 330/124 D; 330/134
(58) Field of Classification Search ................ 455/424, 455/425, 423, 226.4; 330/124 D, 134
See application file for complete search history.

(56) References Cited

U.S. PATENT DOCUMENTS

| | | | |
|---|---|---|---|
| 5,126,686 A * | 6/1992 | Tam | 330/134 |
| 5,963,843 A | 10/1999 | Sit et al. | |
| 6,160,447 A * | 12/2000 | Huang | 330/124 D |
| 6,842,348 B2 | 1/2005 | Lee | |
| 7,142,414 B2 | 11/2006 | Lee et al. | |
| 2004/0198341 A1 | 10/2004 | Lee | |

OTHER PUBLICATIONS

ADC Telecommunications, Inc.; RF Worx® SignalOn™ Series; Jun. 2004; 8 pgs.
ADC Telecommunications, Inc.; RDS-2 Redundant Amplifier Switch RF Worx® Signal Protection User Manual; Jul. 2000; 40 pgs.

* cited by examiner

*Primary Examiner*—Sanh D Phu

(57) ABSTRACT

The present disclosure relates to a switching device having a display that allows an operator to readily visually assess the signal strength of both a primary signal and a back-up signal. In certain embodiments, the information relating to the signal strength of the primary and back-up signal is provided on a graphic display. In certain other embodiments, the signal strength of the back-up signal is displayed relative to the signal strength of the primary signal.

23 Claims, 13 Drawing Sheets

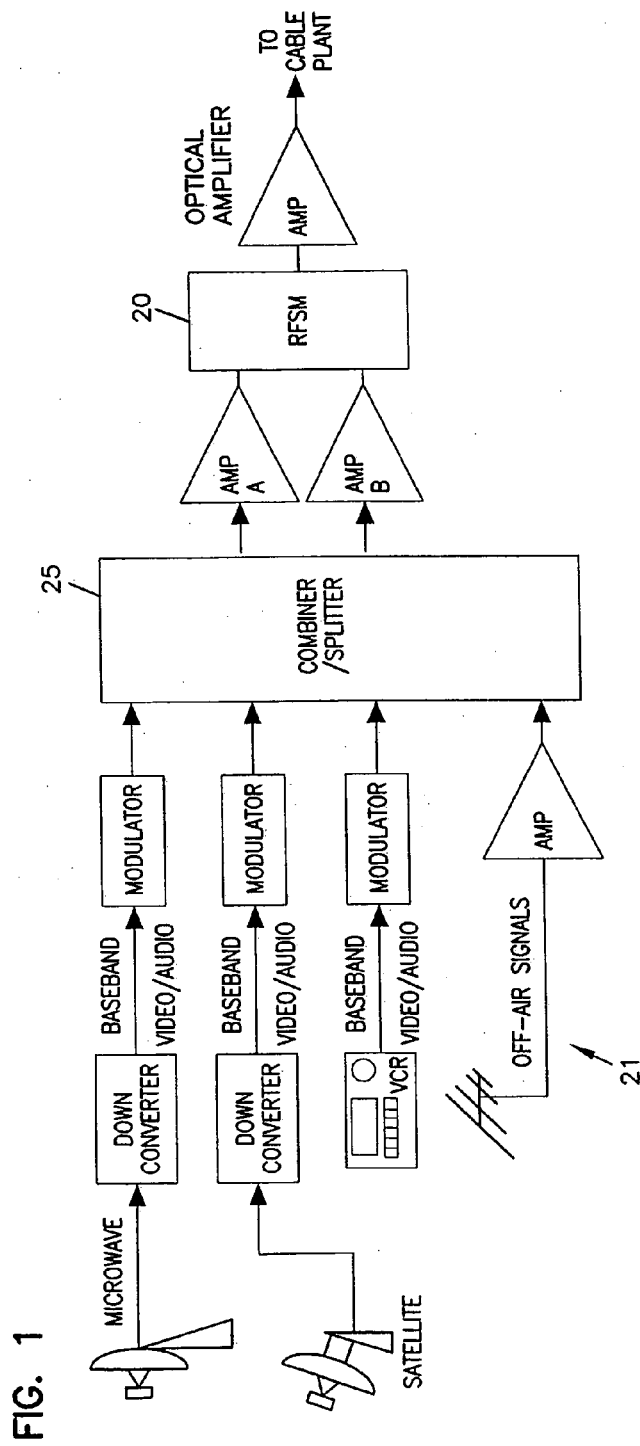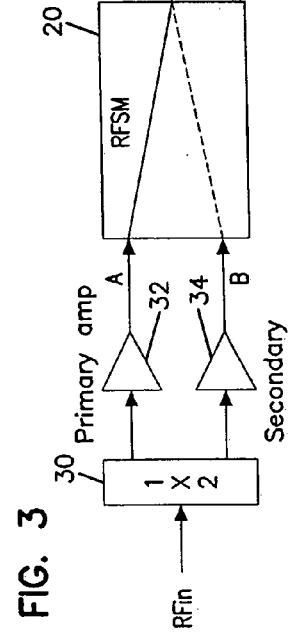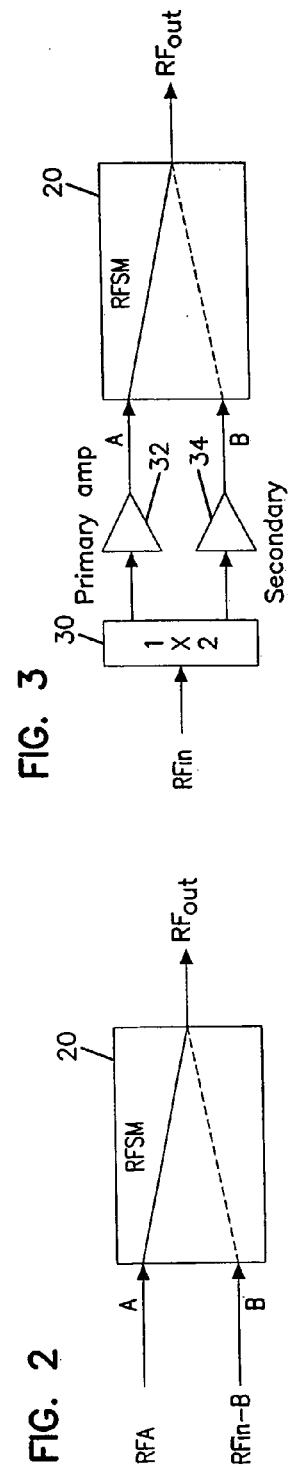

RF SWITCHING DEVICE

CROSS-REFERENCE TO RELATED APPLICATION

This application claims the benefit of U.S. Provisional Patent Application Ser. No. 60/710,955, filed Aug. 24, 2005, which is hereby incorporated by reference in its entirety.

TECHNICAL FIELD

The present invention relates to the transmission of broadband signals in audio, video and data transmission systems. More particularly, the present invention relates to switching circuits for components in audio, video and data transmissions.

BACKGROUND

In recent years, the cable television industry has grown tremendously. As the cable television industry consumer base has grown, it has been increasingly important to minimize breakdowns in cable television systems in order to avoid loss of service to customers. Moreover, with the advent of telephony and data carried on cable television systems, reliability has become even more important because system failures can result in the interruption of emergency phone calls or other critical communications.

Typically, a cable television system includes a location for receiving and distributing program signals, which are broadband radio-frequency "RF" signals (i.e., 5 MHz to 1,000 MHz). This location is commonly known as a headend where incoming program signals are received from sources such as a satellite dish, an antenna, a VCR tape, and the like. For most incoming broadband signal channels, the headend has individual modulators for modulating each of the signals to the appropriate frequency band for its particular channel. The modules each provide output signals that are fed into a combiner network. The combiner network combines all of the signals received from the various channels on one wide band of frequencies. Because signals lose approximately 3 dB (decibels) for every 2 signals combined, the combined signal output must be amplified to compensate for a loss. A high-powered amplifier amplifies the combined signal to produce an amplified combined signal, which is then transmitted to a splitter network. The splitter network divides the amplified combined signal into numerous signals for distribution to multiple locations.

Amplifiers in the headend are prone to breakdowns and operational failures because such amplifiers typically run at high power levels to reduce signal distortion. The high power levels produce heat that can cause degradation of the semiconductors and, ultimately, amplifier failure. Because the headend may be operated electronically from a remote location, it is often unattended by a human operator. Therefore, service to the affected customers can be delayed until a human operator is dispatched to correct the problem. Such delays are expensive to the cable television industry and result in customer frustration and dissatisfaction.

Switching circuitry has been used to address the problems associated with amplifier reliability (e.g., see U.S. Pat. No. 5,963,843 which is hereby incorporated by reference in its entirety). Switching circuitry provides a means for the cable operator to have a backup signal (e.g., from a back-up amplifier) that can be automatically or manually switched into a system with no down-time should a primary signal (e.g., from a primary amplifier) fail. In this manner, the switching arrangement provides signal redundancy, which helps improve system reliability. Additional improvements to system reliability and system performance are needed.

SUMMARY

One aspect of the present disclosure relates to an RF switch device having a display that allows an operator to visually assess the signal strengths of primary and secondary (i.e., back-up) signals that are routed through the device.

Examples representative of a variety of inventive aspects are set forth in the description that follows. The inventive aspects relate to individual features as well as combinations of features. It is to be understood that both the forgoing general description and the following detailed description merely provide examples of how the inventive aspects may be put into practice, and are not intended to limit the broad spirit and scope of the inventive aspects.

BRIEF DESCRIPTION OF THE DRAWINGS

FIG. 1 is a block diagram showing an example application for switching modules in accordance with the principles of the present disclosure;

FIG. 2 shows a general A/B switch application for a switching module;

FIG. 3 shows a redundant 1:1 amplifier application for a switching module;

DETAILED DESCRIPTION

Figure 4:
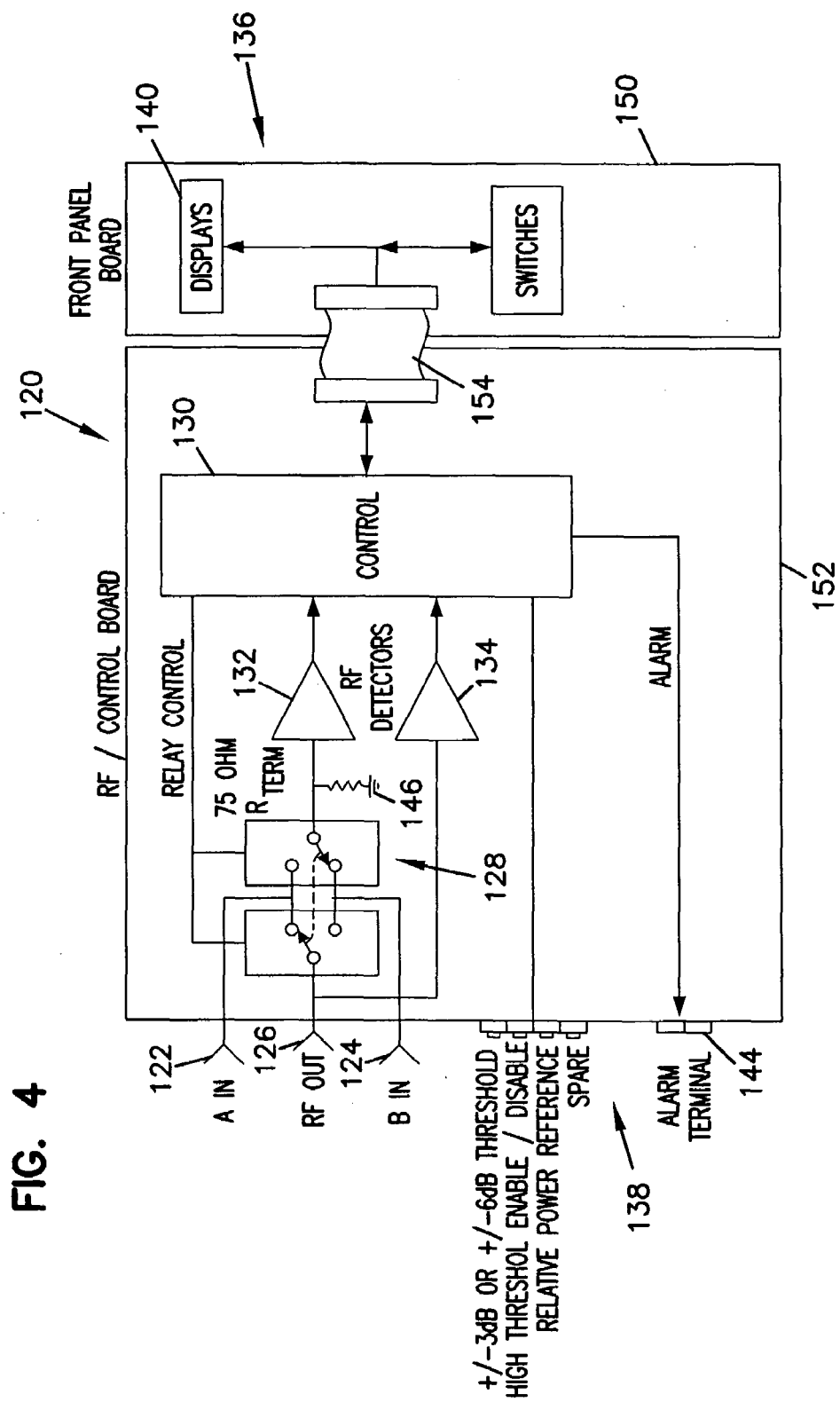
FIG. 4 is a block diagram showing circuitry for a switching module having features that are examples of inventive aspects in accordance with the principles of the present disclosure, the circuitry is shown connecting a primary input connector to an output connector.

In general, the present disclosure relates to a switching device having a display that allows an operator to readily visually assess the signal strength of both a primary signal and a back-up signal. In certain embodiments, the information relating to the signal strength of the primary and back-up signal is provided on a graphic display.

In certain other embodiments, the signal strength of the back-up signal is displayed relative to the signal strength of the primary signal. For example, in one embodiment, a power level of the primary signal is used as a reference value for displaying the power levels of both the primary and secondary signals. By knowing the relative signal strengths of the primary and back-up signals, the operator is ensured that a good feed will be provided in the event the output of the switching device switches from the primary feed to the back-up feed.

FIG. 1 is a block diagram showing an example application for a switching device 20 in accordance with the principles of the present disclosure. The diagram of FIG. 1 shows a head-end 21 of a cable television system. The headend 21 is a location where program signals are received from sources such as a satellite dish, microwave, an antenna, a VCR tape, and the like. Incoming signals are processed by components such as down converters, modulators, amplifiers and a network of combiners 25. Signals output from the combiners 25 are typically amplified prior to being transmitted to end subscribers. The switching device 20 provides signal redundancy by allowing signal feeds to be selected between first and second amplifiers A, B. In other words, in the event a primary signal from amplifier A fails, the switching device 20 switches the signal feed from amplifier A to amplifier B thereby preventing operational failure.

FIG. 2 shows the switching device 20 used as a conventional A/B switch. In this application, a main input signal RFA is typically passed through the switching device. However, in the event the RFA signal fails, the switching device 20 can automatically switch to the back-up signal RFin-B. Alternatively, the switching device 20 can be manually switched between the main input signal and the back-up signal.

FIG. 3 shows the switching device 20 used in a redundant 1:1 amplifier application. A passive splitter 30 splits a signal RFin to a primary amp 32 and a secondary (i.e., back-up) amp 34. The output RFout of the switching device 20 is normally fed from the primary amp 32. However, in the event the primary amp 32 fails, the switching device 20 automatically switches from the primary amp 32 to the secondary amp 34. In certain embodiments, the switching module can also be manually switched between the primary amp 32 and the secondary amp 34.

Figure 5:
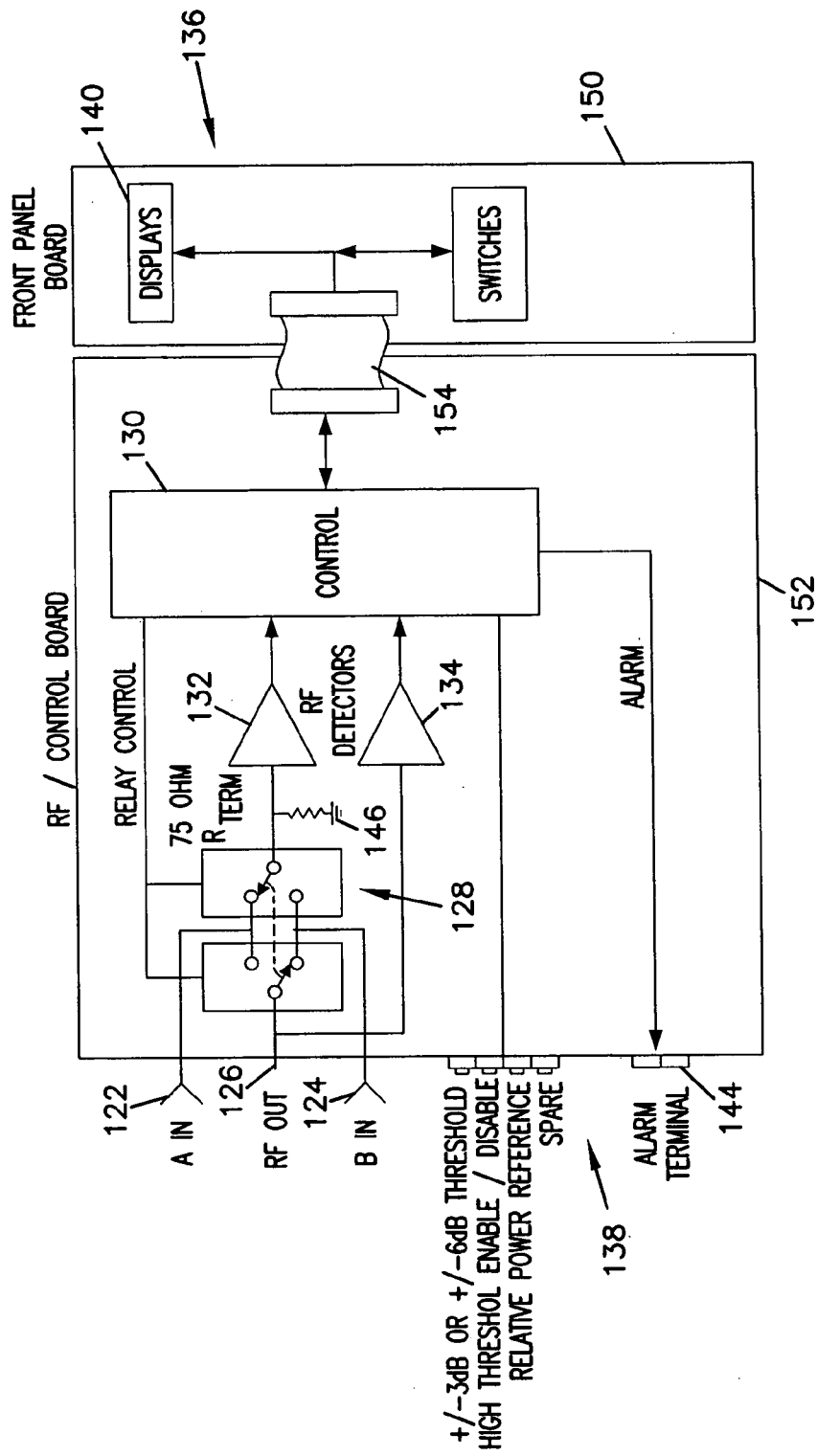
FIG. 5 shows the circuitry of FIG. 4 switched to a configuration where the output connector is connected to a secondary/back-up input connector.
Figure 6:
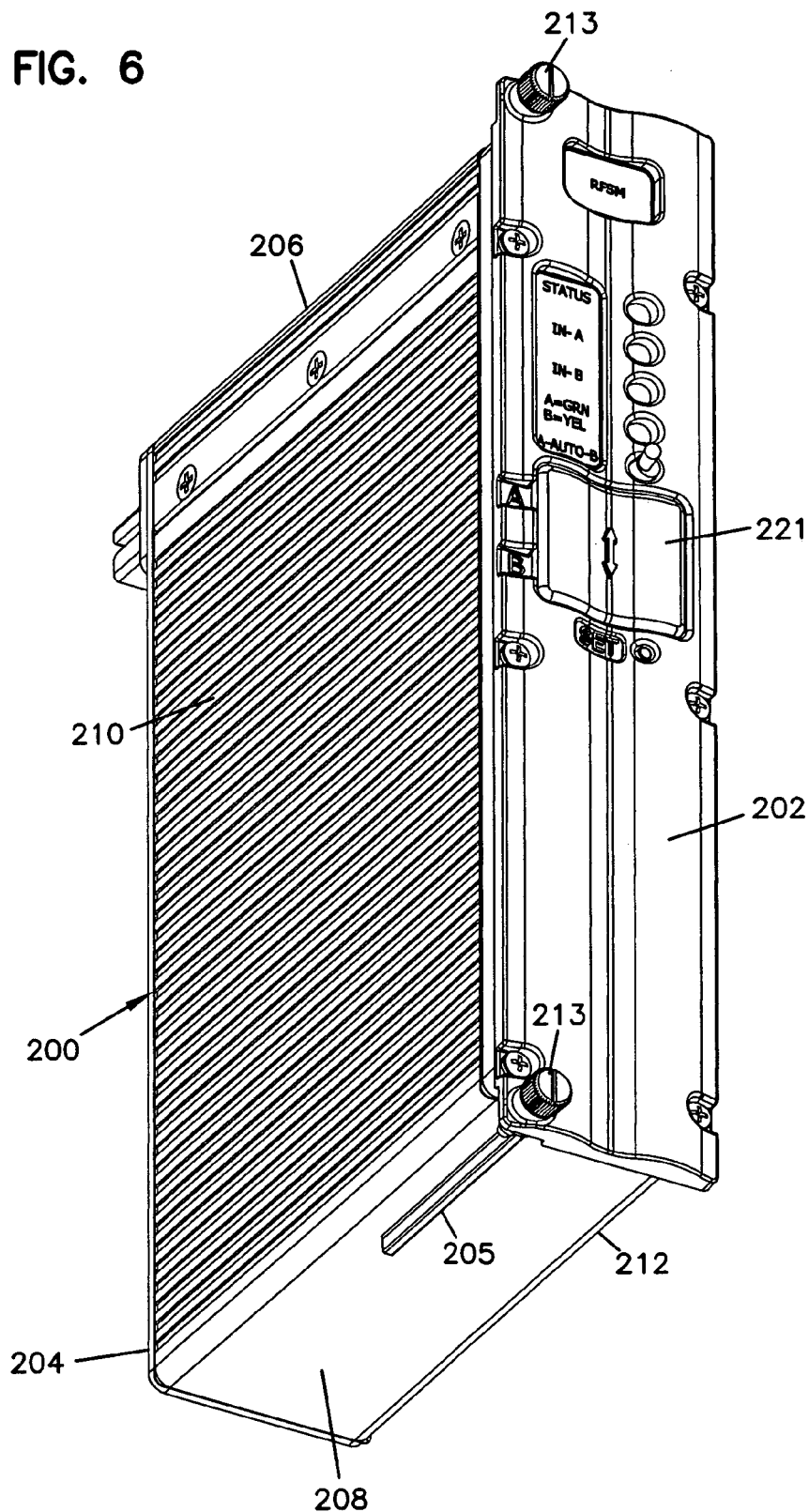
FIG. 6 is a front perspective view of a module having a module housing adapted to house/mount circuitry such as the circuitry of FIGS. 4 and 5.

FIGS. 4 and 5 are circuit block diagrams showing circuitry 120 for an example switching module in accordance with the principles of the present disclosure. The circuitry 120 includes a primary input connector 122 for inputting the primary signal, a secondary input connector 124 for inputting a back-up signal, and an output connector 126 for outputting either the primary or the back-up signal from the switching module. A switching arrangement 128 determines whether the primary signal or the back-up signal is output through the output connector 126. A controller circuit 130 controls the switching arrangement 128. RF power detectors 132, 134 monitor the RF signal powers of the primary and back-up signals. The output of the RF power detectors is read/sampled by a microprocessor of the controller 130 to determine switching operations and alarming activity. The controller 130 further interfaces with a front user interface 136, a rear user interface 138 and alarm terminals 144.

In use of the module, a primary signal (e.g., from a first amplifier) is input through the primary input connector 122 and a back-up signal (e.g., from a second amplifier) is input through the secondary input connector 124. If the primary signal has a power level within an acceptable range, the switching arrangement 128 electrically connects the primary input connector 122 to the output connector 126 and also terminates the secondary input connector 124 to ground 146 (see FIG. 4). In this configuration, the primary signal is output through the output connector 126. Concurrently, RF power detector 132 monitors the signal strength of the back-up signal and the RF power detector 134 monitors the signal strength of the primary signal. The controller 130 reads the power level information from the RF power detectors 132, 134 and controls a visual display 140 at the front user interface 136 such that the power levels of the primary and back-up signals are visually displayed at the front of the module. In the event the primary signal fails while the secondary signal is acceptable, the switching arrangement 128 moves to the relay/switch configuration of FIG. 5. In this relay/switch configuration, the secondary input connector 124 is connected to the output connector 126 and the primary input connector 122 is terminated to ground 146. As so configured, the back-up signal is output from the module through the output connector 126, the RF power detector 134 monitors the strength of the back-up signal and the RF power detector 132 monitors the strength of the primary signal. When the primary signal or the secondary signal fails, the controller 130 can generate an alarm signal that is output to an alarm through the alarm terminals 144.

In a "relative" mode of operation, the power level of the primary signal and the back-up signal are displayed relative to a reference power level derived from the primary signal. For example, during calibration, the controller can sample the power level of the primary signal to set a reference power level. If the reference power level is within an acceptable power level range, the reference power level is used as a reference value relative to which the power levels of both the primary signal and back-up signals are displayed. Thus, during operation of the system, an operator can readily visually assess the relative strengths of the primary and back-up signals as compared to the reference power level of the primary signal. This gives the operator the opportunity to anticipate signal failures by noting changes in the power levels of the primary and back-up signals, over time, as compared to the reference power level. The display also reassures the operator that the power levels of the primary and back-up signals are within an acceptable range of one another.

During calibration, the controller first verifies whether the primary signal path passes calibration. If the primary signal passes calibration, the primary input connector 122 is connected to the output connector 126 such that the primary signal is selected to be output from the module. If the primary signal fails, the calibration process stops and an alarm (e.g., a local and/or remote alarm) is triggered. In this embodiment, the primary signal should always pass calibration. If the back-up signal fails calibration while the primary signal passes calibration, the primary signal is output from the module and an alarm (e.g., a local and/or remote alarm) is triggered with respect to the back-up signal.

In an "independent" mode of operation, the power level of the primary signal is displayed relative to a reference power level derived from the primary signal and the power level of the back-up signal is displayed relative to a reference power level derived from the back-up signal. For example, during calibration, the controller can sample the power levels of the primary signal and the back-up signal to set reference power levels. If the reference power level of the primary signal is within an acceptable power level range, the reference power level of the primary signal is used as a reference value relative to which the power level of the primary signal is displayed over time. If the reference power level of the back-up signal is within an acceptable power level range, the reference power level of the back-up signal is used as a reference value relative to which the power level of the back-up signal is displayed over time. If the power level of the primary signal is not within an acceptable range at calibration, an alarm is activated and the power level of the primary signal is not displayed. If the power level of the back-up signal is not within an acceptable range at calibration, an alarm is activated and the power level of the back-up signal is not displayed.

Referring still to FIGS. 4 and 5, the circuitry 120 is depicted including a front circuit board 150 and a control circuit board 152. The circuit boards 150, 152 are electrically interconnected by a structure such as a ribbon cable 154. The connectors 122, 124, and 126, the switching arrangement 128, the RF power detectors 132, 134, the controller 130, the rear user interface 138 and the alarm terminals 144 are all provided at the control circuit board 152. The front user interface 136 is provided at the front circuit board 150.

The RF power detectors serve to monitor the RF signal power. Example RF power detectors include log amplifiers that receive the signals as an input and generate a DC voltage proportional to the input as an output. An example dynamic range of each detector is 60 dB. The voltage output from the RF power detectors can be read by the microprocessor of the controller. Example RF power detectors are sold by Linear Technology Corporation of Milpitas Calif., and have model number LT5534 (50 Mhz to 3 GHz RF Power Detector with 60 dB Dynamic Range).

In one embodiment the switching arrangement 128 can include a pair of relays. In one embodiment the relays can be two 75 ohm co-planar devices. One of the relays performs switching of the signal path, and the other provides a termination of the inactive RF input to ground. Relays can be configured to auto revert to the main signal path with a 15 second hold-off time. The delay will prevent contact chatter in the event the main path is near threshold. In one embodiment, there shall be no hold-off condition in switching away from the main path, only reverting to the main path.

The controller 130 can include any number of conventional components for controlling operation of the module. For example, the controller 130 can include a microprocessor, memory, output drivers and an analog to digital converter. The memory can be used to store software/firmware for use in power-up, calibration, performing switching operations, controlling the visual display and the overall control of the module. The memory can also be used to save settings (switch configuration and calibration data) in the event of a power failure. In certain embodiments, the module includes an interface (e.g., an RS-232 serial interface) for allowing the controller to communicate with a remote personal computer.

In certain embodiments, the controller can include circuitry that monitors the onboard power provided to the module. In the event of a power failure, the relays of the switch arrangement are locked in place and the configuration of the relays at the time of the power failure is saved in memory. Upon power-up after the power failure, the relays of the switch arrangement can be default set to the configuration prior to the power failure.

Figure 10:
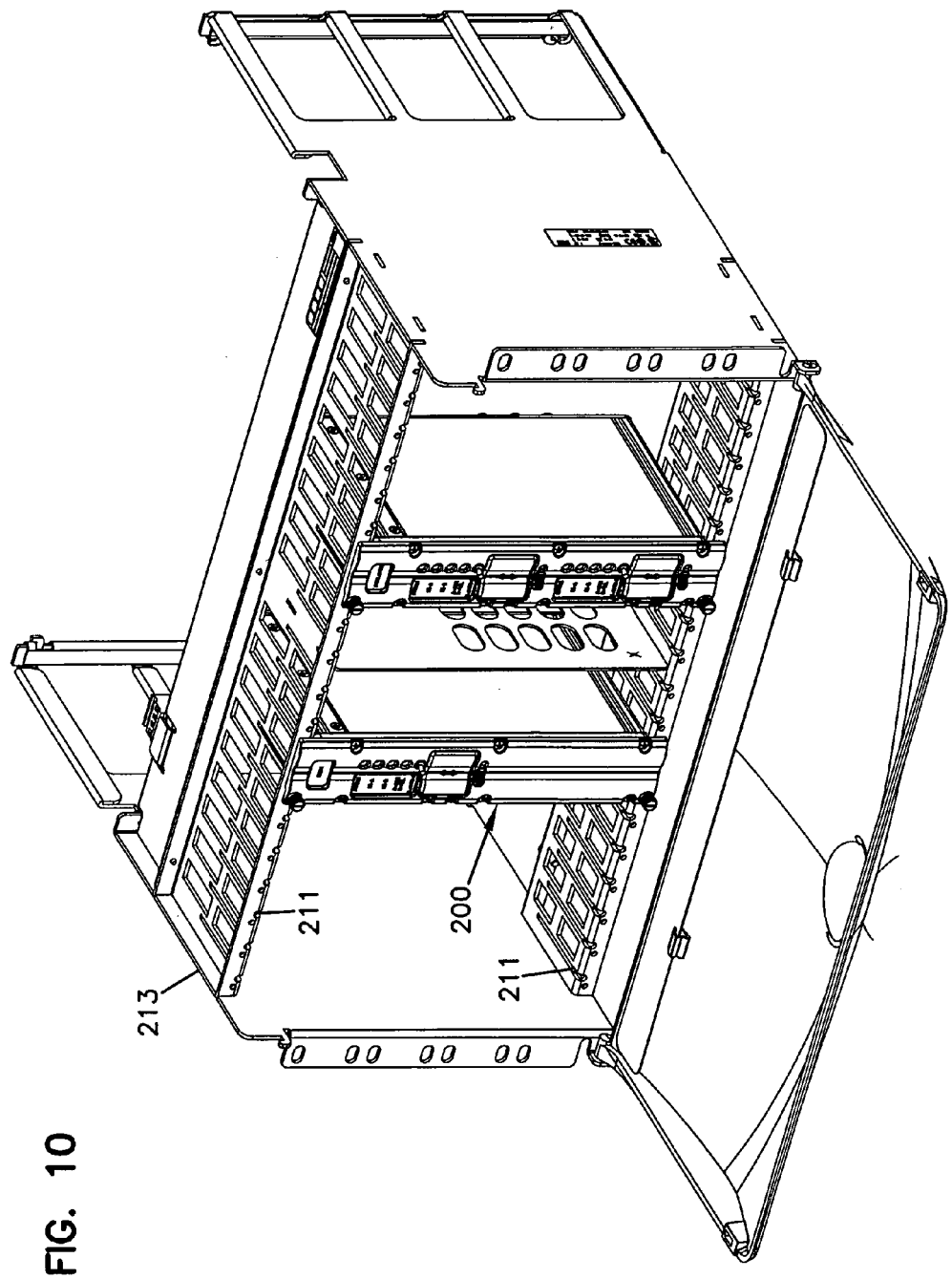
FIG. 10 is a perspective view of a chassis adapted to receive the module of FIG. 6-9.

FIGS. 6-9 show a module housing 200 adapted for housing/mounting the circuitry 120 shown schematically at FIGS. 4 and 5. In one embodiment, the module housing 200 has a generally rectangular configuration including a front face plate 202, a rear panel 204, top side 206, a bottom side 208, and left and right sides 210, 212. The top and bottom sides 206, 208 can include guide rails 205 that fit within corresponding slots 211 in a chassis 213 (see FIG. 10) to facilitate insertion of the module housing 200 into the chassis 213. The front face plate 202 has top and bottom portions that extend above and below the top and bottom sides 206, 208, respectively. Fasteners 213 (e.g., thumb screws) are provided at the upper and lower portions of the front panel 202 for connecting the module 200 to its corresponding chassis 213. The module housing 200 is preferably made of a material adapted to provide a shield for blocking electromagnetic radiation. In one embodiment, the module housing 200 includes a metal material such as aluminum. In one embodiment, the dimensions of the module housing 200 are approximately 1.7 inches wide, 6 inches deep and about 8.5 inches high.

Figure 11A:
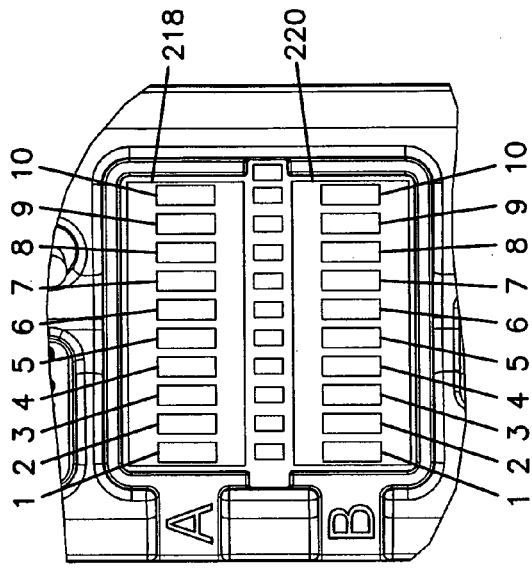
FIG. 11A is an enlarged view of the graphical display of FIG. 11.
Figure 11:
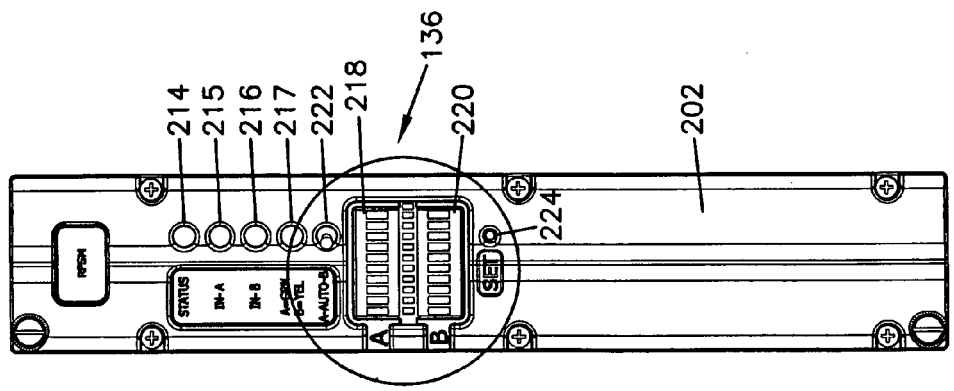
FIG. 11 is a front view of the module of FIGS. 6-11 with a front cover of the module removed to show graphical displays for displaying power levels of primary and back-up signals transmitted to the module.

As shown at FIGS. 11 and 11A, the front user interface 136 of the module is provided at the front panel 202 of the module housing 200. As shown best shown at FIG. 11A, the front user interface 136 includes two graphical displays 218, 220 each having a horizontal row of bars. The graphical displays 218, 220 are adapted to provide the operator with a visual indication relating to the power levels of the primary signal and the back-up signal. The displays 218, 220 preferably provide continuous, generally real time visual readings regarding the power levels of the primary signal and the secondary signal. In certain embodiments, the displays 218, 220 show ranges of power levels having upper and lower thresholds. Power levels beyond the thresholds of the ranges may provide an indication that a failure condition has occurred. In one embodiment, the switch arrangement 128 changes feed from the primary signal to the back-up signal if the power level of the primary signal decreases to a level at or below the lower threshold of the display or increases to a level at or above the threshold level of the display. A protective cover 221 or lens can be used to cover the displays 218, 220 (see FIG. 6).

If the power level the primary or back-up signal moves outside the threshold range/window of the displays 218, 220, the display corresponding to the failed signal can provide a visual indication of the failure. For example, in one embodiment, all of the bars flash to indicate a failure. In another embodiment, all of the bars illuminate to indicate a failure. In still another embodiment, all of the bars go blank to indicate a failure. In a further embodiment, the illumination of only the left-most bar indicates a low threshold failure, while the illumination of only the right-most bar indicates a high threshold failure. Also, in the event of a failure, a separate alarm signal can be generated locally (e.g., through LED's 215, 216) and/or remotely (e.g., by the controller via alarm terminals 144).

In an example embodiment, the upper threshold of the displayed range is +3 dB relative to a reference value, and the lower threshold is −3 dB relative to a reference value. In another example embodiment, the upper threshold of the displayed range is +6 dB relative to a reference value, and the lower threshold is −6 dB relative to a reference value. Thus, by changing the thresholds of the displays, the scales of the displays are altered. For example, in the depicted embodiment, one increment will equal 1 dB if the thresholds equal +/−3 dB, and one increment will equal 2 dB if the thresholds equal +/−6 dB.

In the depicted embodiment, graphic displays 218, 220 include 10 bar segments that can be illuminated to display the power levels of the primary and back-up signals in a plurality of increments. In the depicted embodiment, a reference power level value is assigned to the center two bars of each display 218, 220. As long as the power level of the signal being monitored remains within a predetermined range of the reference value, the two center bars will remain illuminated. However, in the event the actual power level declines outside the predetermined power level range relative to the reference value, bars to the left of the reference value will be illuminated. The greater the reduction in the power level, the more to the left the bars are incrementally illuminated. Similarly, if the power level increases beyond the predetermined range relative to the reference value, the bars to the right of the center two bars will be illuminated. The greater the increase in the power level, the more to the right the bars are incrementally illuminated. For ease of description, the bars of the displays 218, 220 have been numbered 1-10 (see FIG. 11A), with bars 5 and 6 being the center bars.

Figure 12:
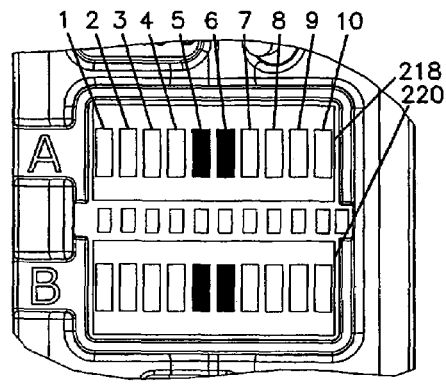
FIGS. 12-15 show the graphical display of FIG. 11A with different bars of the displays illuminated to show example power level readings.

FIG. 12 shows displays 218, 220 each having the center bars (i.e., bars 5 and 6) illuminated. When the module is in the "relative" mode, this display indicates that both the primary signal and the back-up signal have power levels near the reference power level established from the primary signal at calibration. For example, in the +/−3 dB threshold scale, bars 5 and 6 of both displays remain illuminated as long as the primary and back-up signal strengths do not rise 1 dB or more above the reference power level value set from the primary signal at calibration, or fall 1 dB or more below the reference power level value set from the primary signal at calibration. Thus, the user knows that the primary and back-up signals have power levels that are relatively close to one another. When the module is in the "independent" mode, this display indicates that the primary signal has a power level near (e.g., within about +/−1 dB) the reference power level set from the primary signal at calibration, and the back-up signal has a power level near (e.g., within about +/−1 dB) the reference power level set from the back-up signal at calibration.

Figure 13:
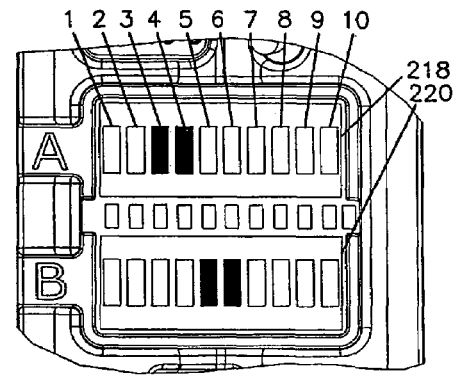

FIG. 13 shows display 218 having bars 3 and 4 illuminated and shows display 220 having bars 5 and 6 illuminated. When the module is in the "relative" mode and the thresholds of the display have been set to +/−3 dB, display 218 indicates that the power level of the primary signal has fallen at least 1 dB relative to the reference power level set from the primary signal at calibration, but has not yet fallen 2 dB or more relative to the reference power level set from the primary signal at calibration. The display also shows that the back-up signal power level has not risen 1 dB or more above the reference power level value set from the primary signal at calibration, or fallen 1 dB or more below the reference power level of the primary signal set at calibration. In reading the display, a user knows that the primary and back-up signals both have acceptable power levels, but that the back-up signal has a power level greater than the power level of the primary signal. When the module is in the "independent" mode and the thresholds of the display have been set to +/−3 dB, this display indicates that the power level of the primary signal has fallen at least 1 dB relative to the reference power level set from the primary signal at calibration, but has not yet fallen 2 dB or more relative to the reference power level set from the primary signal at calibration. The display also shows that the back-up signal power level has not risen 1 dB or more above the reference power level value set from the back-up signal at calibration, or fallen 1 dB or more below the reference power level of the back-up signal set at calibration.

Figure 14:
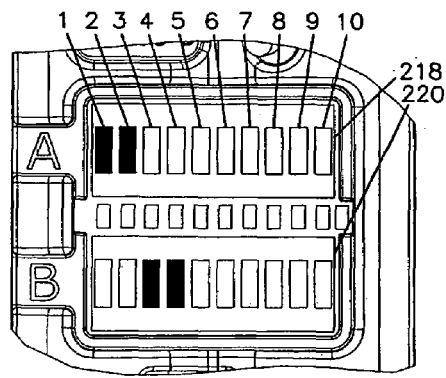

FIG. 14 shows display 218 having bars 1 and 2 illuminated and shows display 220 having bars 3 and 4 illuminated. When the module is in the "relative" mode and the thresholds of the display have been set to +/−3 dB, this display indicates that the power level of the primary signal has fallen at least 2 dB relative to the reference power level set from the primary signal at calibration, but has not yet fallen 3 dB or more relative to the reference power level set from the primary signal at calibration. The display also shows that the back-up signal power level has fallen at least 1 dB relative to the reference power level set from the primary signal at calibration, but has not yet fallen 2 dB or more relative to the reference power level set from the primary signal at calibration. In reading the display, a user knows that the primary and back-up signals both have acceptable power levels, but that primary signal is approaching the lower threshold/failure value, and the back-up signal has a power level greater than the power level of the primary signal. When the module is in the "independent" mode and the thresholds of the display have been set to +/−3 dB, this display indicates that the power level of the primary signal has fallen at least 2 dB relative to the reference power level set from the primary signal at calibration, but has not yet fallen 3 dB or more relative to the reference power level set from the primary signal at calibration. The display also shows that the back-up signal power level has fallen at least 1 dB relative to the reference power level set from the back-up signal at calibration, but has not yet fallen 2 dB or more relative to the reference power level set from the back-up signal at calibration.

Figure 15:
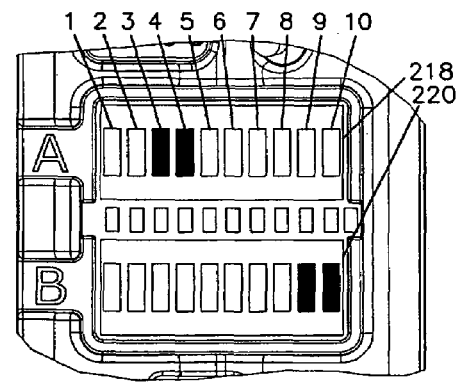
Figure 16:
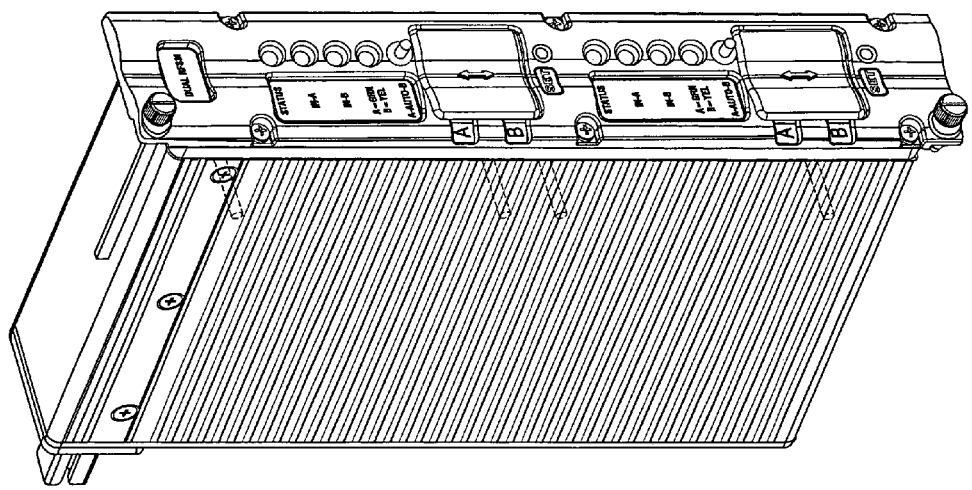
FIG. 16 is a front perspective view of a dual version of the module of FIGS. 6-9.
Figure 17:
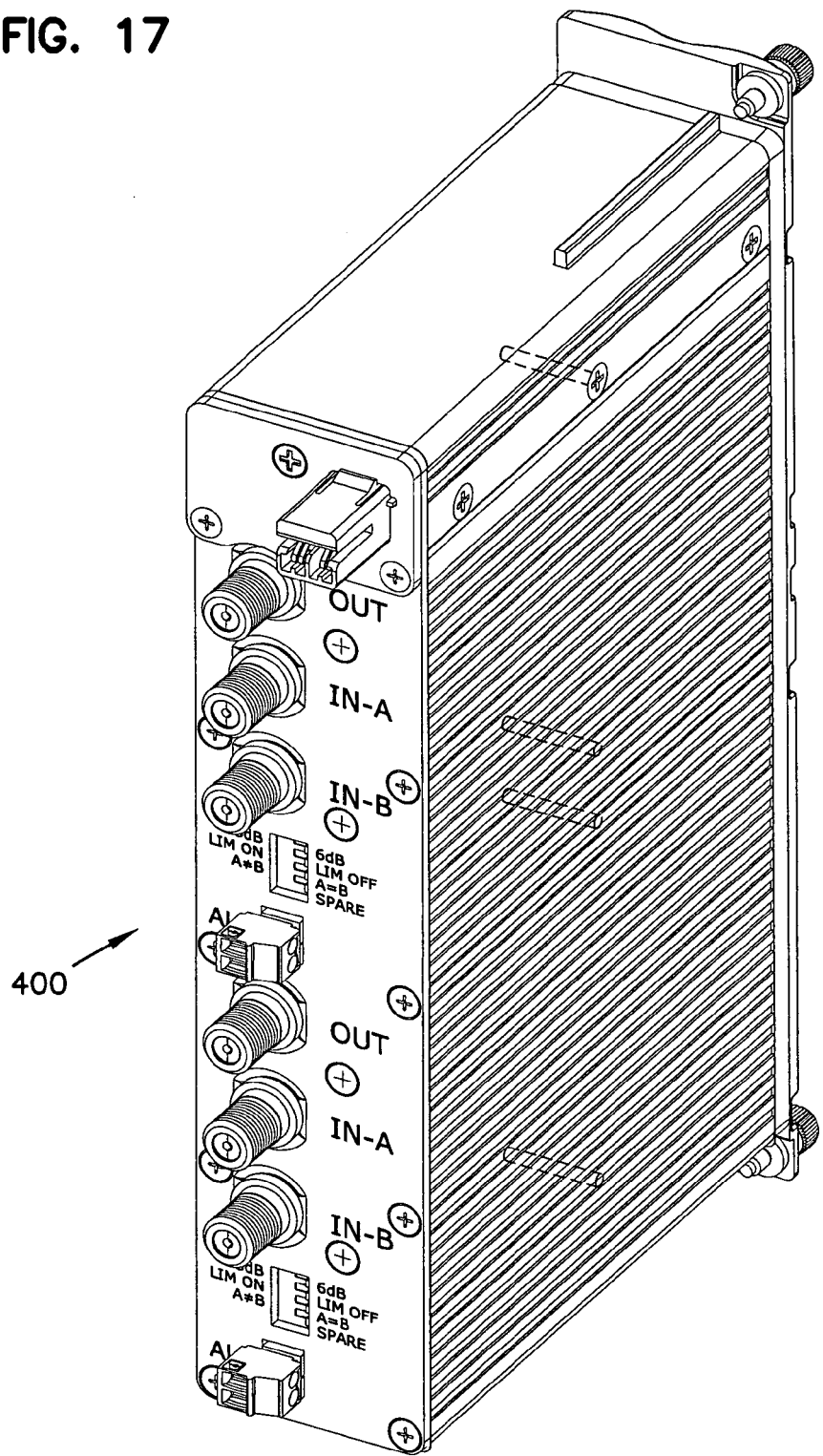
FIG. 17 is a rear perspective view of the module of FIG. 16.
Figure 18:
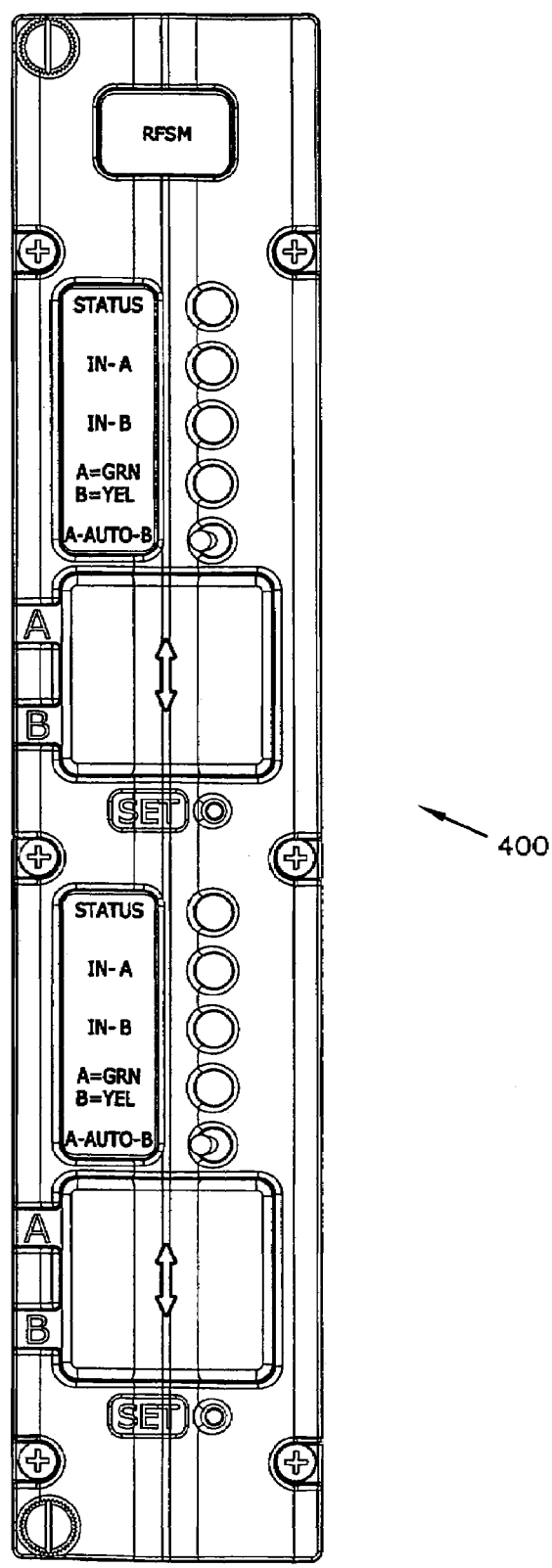
FIG. 18 is a front elevational view of the module of FIG. 16.
Figure 19:
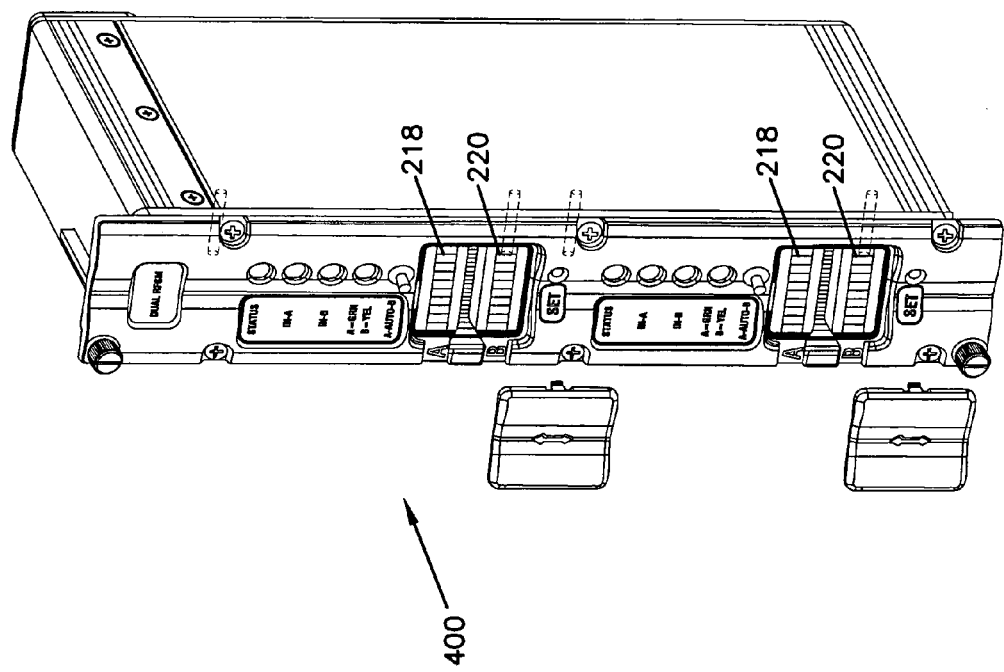
FIG. 19 is a front perspective view of the module of FIG. 16 with front covers of the module removed to show front graphical displays of the module.

FIG. 15 shows display 218 having bars 3 and 4 illuminated and shows display 220 having bars 7 and 8 illuminated. When the module is in the "relative" mode and the thresholds of the display have been set to +/−3 dB, this display indicates that the power level of the primary signal has fallen at least 1 dB relative to the reference power level set from the primary signal at calibration, but has not yet fallen 2 dB or more relative to the reference power level set from the primary signal at calibration. The display also shows that the back-up signal power level has increased at least 2 dB relative to the reference power level set from the primary signal at calibration, but has not yet increased 3 dB or more relative to the reference power level set from the primary signal at calibration. In reading the display, a user knows that the primary and back-up signals both have acceptable power levels, and the back-up signal has a power level greater than the power level of the primary signal. When the module is in the "independent" mode and the thresholds of the display have been set to +/−3 dB, this display indicates that the power level of the primary signal has fallen at least 1 dB relative to the reference power level set from the primary signal at calibration, but has not yet fallen 2 dB or more relative to the reference power level set from the primary signal at calibration. The display also shows that the back-up signal power level has increased at least 2 dB relative to the reference power level set from the back-up signal at calibration, but has not yet increased 3 dB or more relative to the reference power level set from the back-up signal at calibration.

Referring back to FIG. 11, the front user interface 136 of the module also includes four light emitting diodes (LEDs) 214-217. The LEDs 214-217 provide additional information to the operator. For example, LED 214 can illuminate green during normal operations, and red if there is a power failure or controller failure. LED 215 can illuminate green when the primary signal has a signal strength within the range of the display 218, turn red for a fault condition (e.g., if the primary signal has a signal strength outside the range of the display 218 or fails calibration) and flash green when the primary signal has been manually selected at switch 222. LED 216 can illuminate green when the back-up signal is within the range of display 220, turn red for a fault condition (e.g., if the strength of the back-up signal moves outside the range of display 220 or the back-up signal fails calibration), and flash green if the back-up signal has been manually selected by switch 222. LED 217 can illuminate green when the primary signal is active, and yellow when the back-up signal is active.

The front panel 202 also includes switches for allowing an operator to interface with the module. For example, switch 222 is a three-position switch that allows the operator to manually select whether the primary signal or the back-up signal are output from the module. The switch also allows the operator to select an auto mode. In the auto mode, the controller will automatically control whether the primary signal or the back-up signal are output from the module.

During the manual mode operation as set by switch 222, either the primary signal or the back-up signal may be selected. In certain embodiments, the non-selected path shall not be monitored, alarm contact failure shall be cleared, and the LED and bar graph display corresponding to the non-selected signal path shall be turned off. All calibration and information is preferably maintained (e.g., stored in the memory of the controller) and restored once the automatic mode of switch 222 is re-selected. During the automatic mode of operation as set by switch 222, the primary signal (i.e., the signal input through connector 122) is the preferred signal and the module controller selects the primary signal or switch back to the primary signal if it is not in a failed state.

The front panel 202 also includes set button 224 that the operator can press to calibrate the module and set the reference values for the displays 218, 220. When the set button is pressed, the controller compares the signal strengths of the primary and back-up signals to minimum/maximum input limits (e.g., 20 dbmv to 71 dbmv). The power level information for the primary and back-up signals is provided to the controller from the signal power detectors. A minimum or maximum reading will set an alarm. If the signal strength readings are acceptable, the controller sets the reference power level values for the displays 218, 220 as described above. The switching arrangement preferably will not change states during calibration.

Figure 7:
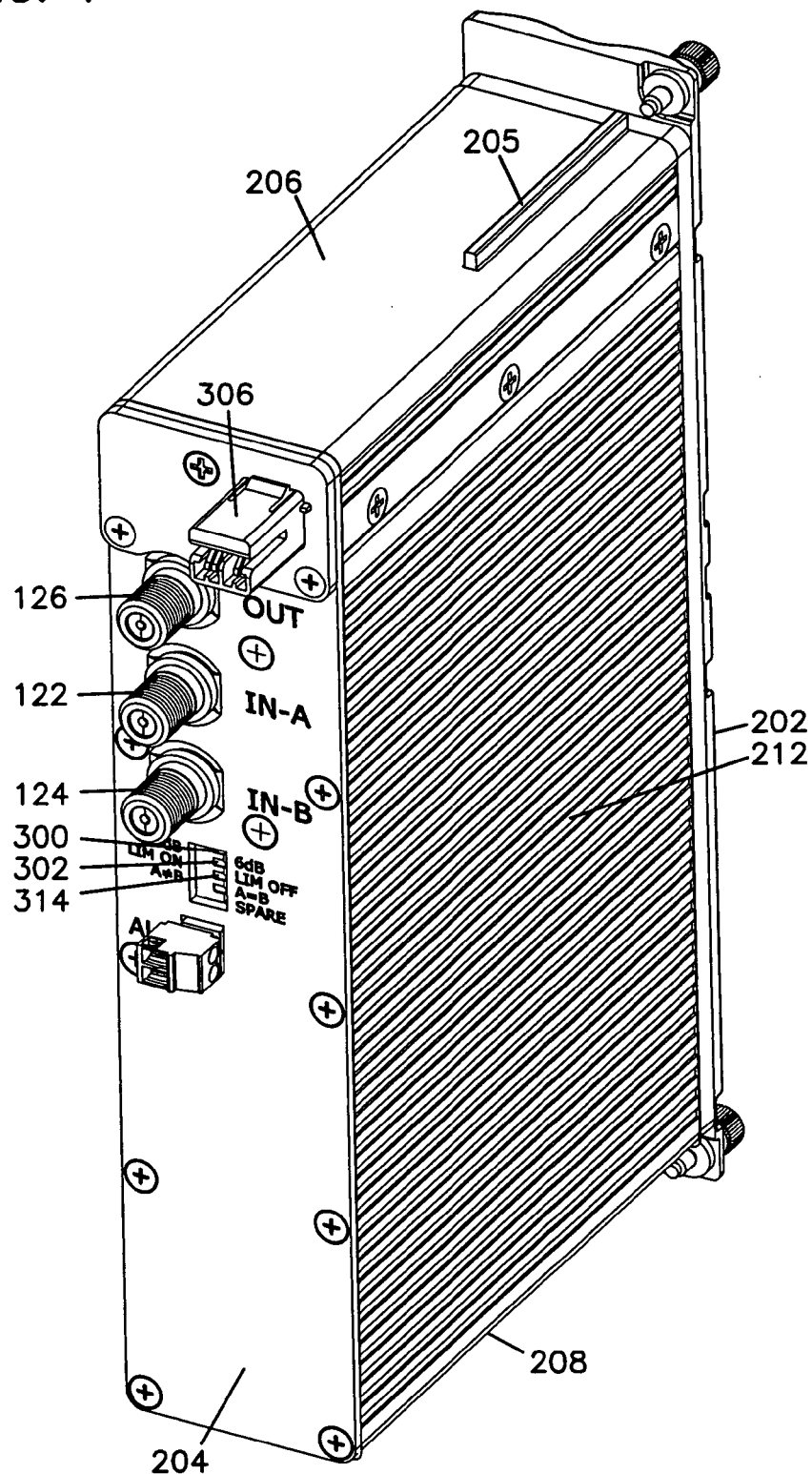
FIG. 7 is a rear perspective view of the module of FIG. 6.
Figure 8:
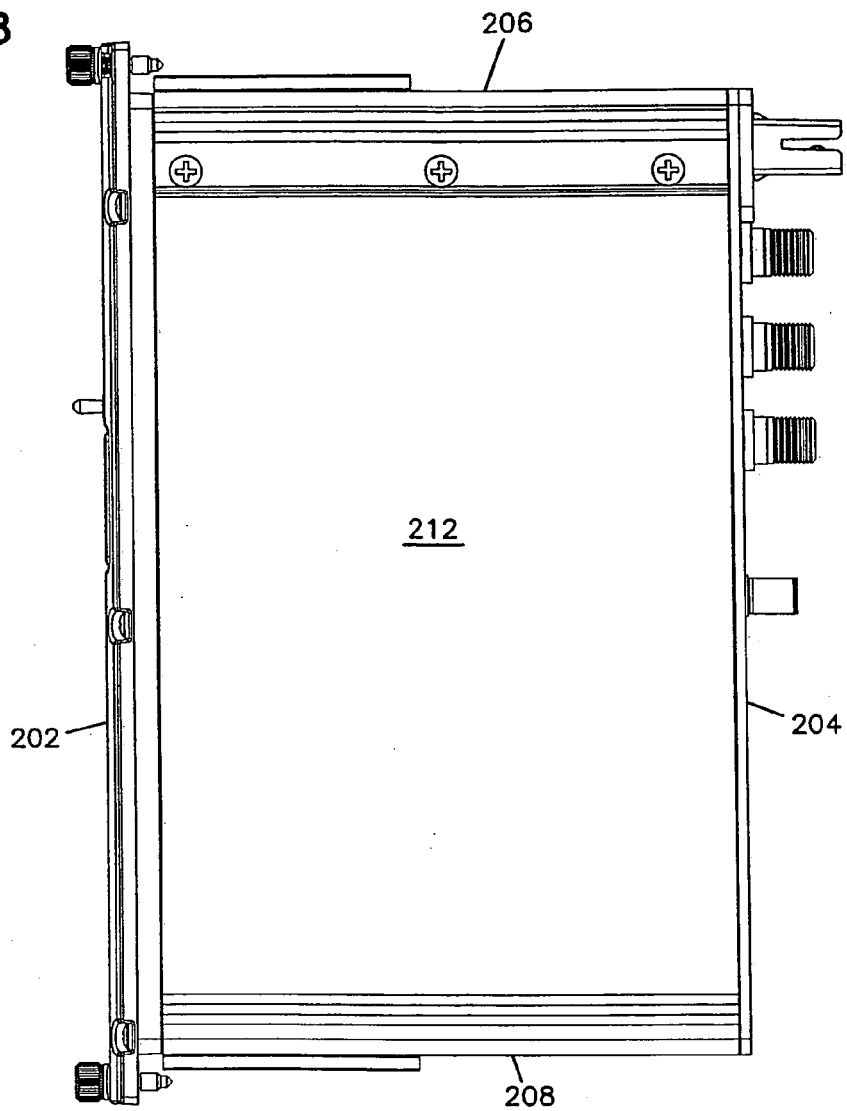
FIG. 8 is a side view of the module of FIG. 6.
Figure 9:
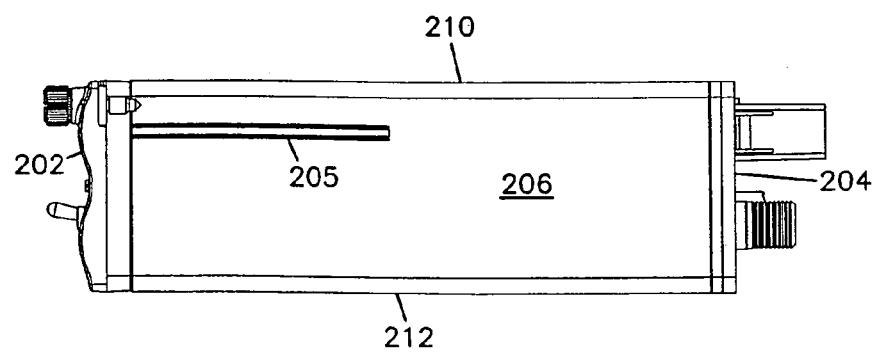
FIG. 9 is a top view of the module of FIG. 6.

As shown at FIG. 7, a number of interface structures are also provided at the rear side of the module. For example, a dip switch 300 allows the operator to select the threshold values for the displays. The default setting for the switch 300 is +/−3 dB. However, if an operator prefers, the range can be switched to other settings such as +/−6 dB. The rear of the module further includes switch 302 that allows the operator to disable the high threshold value. The default setting on this switch is for the high limit not to be disabled. When disabled, the module will not detect high limit failures. The rear side of the module further includes dip switch 304 that is used to select whether the module operates in the "relative" mode or the "independent" mode. The default setting is for the module is the "relative" mode.

Additional components are also mounted at the rear of the module. For example, the primary input connector 122, the secondary input connector 124 and the output connector 126 are all mounted at the rear of the module. Moreover, a power connector 306 is also mounted at the rear of the module. The power connector is adapted to couple to a power source (e.g., a power bus provided at the back of the chassis 213 in which the module is mounted). For example, the connector can connect to a 25 V power supply on the chassis 213. The voltage provided by the chassis 213 can be reduced and regulated by a switching regulator circuit within the module (e.g., the voltage can be regulated to 3.3 V). The power is used to power active components of the module such as LEDs, displays, switches, RF power detectors, and the controller. The rear of the module further includes alarm contacts for allowing the controller to interface with a remote/external alarm.

The protective switching of the module can operate differently depending upon the mode of operation of the module. For example, when the primary signal has been manually selected to provide feed to the output connector 126, in certain embodiments, the module will maintain the switch configuration of FIG. 4, and will not switch to the switch configuration of FIG. 5. Similarly, when the secondary signal has been manually selected to provide feed to the output connector 126, in certain embodiments, the module will maintain the switch configuration of FIG. 5, and will not switch to the switch configuration of FIG. 4. When the module is in the AUTO mode and the switch arrangement is configured as shown at FIG. 4, in certain embodiments, the switch arrangement will move to the configuration of FIG. 5 if the primary signal fails while the back-up signal is acceptable. If the back-up signal is not acceptable, the switch arrangement will remain in the configuration of FIG. 4. When the module is in the AUTO mode and the switch arrangement is configured as shown at FIG. 5, in certain embodiments, the switch arrangement will move to the configuration of FIG. 4 if the back-up signal fails while the primary signal is acceptable. If the primary signal is not acceptable, the switch arrangement remains in the configuration of FIG. 5.

In the depicted embodiment, the displays 218, 220 comprise 10 segment bar displays. However, other displays could also be used. For example, other example displays include dials, digital/numeric readouts, rows of LEDs, or other means for visually conveying power level information to an operator.

The switching module preferably supports application in the 5 MHz to 1,000 MHz range. In one embodiment, insertion loss for the active path shall be 1 dB maximum out of 1 gigahertz. Preferably frequency response flatness shall be +/−0.5 dB or better out to 1 gigahertz. It is also preferred for input/output return loss for all applications to be less than a 20 dB minimum. Furthermore, port-to-port isolation from any input to output for all application is preferably 60 dB minimum.

FIGS. 16-19 show a module 400 that is a dual version of the module of FIGS. 6-9. The module 300 includes two sets of the circuitry of FIGS. 4 and 5. Each set of circuitry includes a pair of bars 218, 220 (see FIG. 19) for providing power level readings corresponding to separate pairs of primary and back-up signals routed through the module 400.

The above specification provides examples of how certain inventive aspects may be put into practice. It will be appreciated that the inventive aspects can be practiced in other ways than those specifically shown and described herein without departing from the spirit and scope of the inventive aspects.

We claim:

1. An RF switch module comprising:
a module housing;
a first input connector provided at the module housing;
a second input connector provided at the module housing;
an output connector provided at the module housing;
a switch arrangement positioned within the housing, the switch arrangement being connected to the first and second input connectors by circuitry, the switch arrangement being switchable between a first configuration where first input connector is electrically connected to the output connector and a second configuration where the second input connector is electrically connected to the output connector, wherein the switch arrangement includes a first relay that selectively connects the first and second input connectors to the output connector, and a second relay that selectively connects the first and second input connectors to ground; and
a display arrangement that visually shows the relative strength of a first signal input though the first input connector as compared to a second signal input through the second input connector.

2. The RF switch module of claim 1, wherein the display arrangement includes a first graph display provided at the module housing for displaying information representative of a power level of the first signal, and the display arrangement also includes a second graph display provided at the module housing for displaying information representative of a power level of the second signal.

3. The RF switch module of claim 2, wherein the first and second graph displays each include a group of bars.

4. The RF switch module of claim 3, wherein the bars are aligned along rows.

5. The RF switch module of claim 4, wherein the rows are horizontal.

6. The RF switch module of claim 1, further comprising a controller positioned within the module housing and sampling circuitry for sampling the first and second signals, wherein the sampling circuitry provides signal power level data to the controller, wherein the controller interfaces with the display arrangement and uses the signal power level data to control the information displayed by the display arrangement.

7. The RF switch module of claim 6, wherein the display arrangement includes first and second displays for displaying power levels of the first and second signals, and wherein the controller uses signal power level data from the first signal to set a reference power level value for both the first and second displays.

8. The RF switch module of claim 7, wherein the first and second displays are capable of showing both increases and decreases in power level relative to the reference power level value.

9. The RF switch module of claim 1, wherein the first signal is received from a first amplifier and the second signal is received from a second amplifier.

10. An RF switch module comprising:
a module housing;
a first input connector for inputting a first signal into the module housing;
a second input connector for inputting a second signal into the module housing;
an output connector provided at the module housing;
a switch arrangement positioned within the housing, the switch arrangement being connected to the first and second input connectors by circuitry, the switch arrangement being switchable between a first configuration where first input connector is electrically connected to the output connector and a second configuration where the second input connector is electrically connected to the output connector; and
a first display for displaying power level information corresponding to the first signal;
a second display for displaying power level information corresponding to the second signal;
the module being operable in a relative mode where the power levels of the first and second signal are displayed relative to a reference power level value derived from the first signal; and
the module also being operable in an independent mode where the power level of the first signal is displayed relative to a reference power level derived from the first signal, and the power level of the second signal is displayed relative to a reference power level derived from the second signal.

11. The RF switch module of claim 10, wherein the first and second displays each include a group of bars.

12. The RF switch module of claim 11, wherein the bars are aligned along rows.

13. The RF switch module of claim 10, wherein the first and second displays are capable of showing both increases and decreases in power level relative to the reference power level values.

14. An RF system comprising:
first and second amplifiers;
a signal output location;
a switch electrically connected to the first and second amplifiers by circuitry, the switch being moveable between a first position where a signal amplified by the first amplifier is output through the signal output location and a second position where a signal amplified by the second amplifier is output through the signal output location;
sampling circuitry for sampling the signals from the first and second amplifiers;
a controller that controls the position of the switch and interfaces with the sampling circuitry to generate power level information with respect to the signals of the first and second amplifiers;
a first display for displaying the power level information generated by the controller for the signal amplified by the first amplifier, the first display being capable of showing a range of power levels including at least three increments; and
a second display for displaying the power level information generated by the controller for the signal amplified by the second amplifier, the second display being capable of showing a range of power levels including at least three increments.

15. The RF switch module of claim 14, wherein the first and second displays each include a group of bars.

16. The RF switch module of claim 15, wherein the bars are aligned along rows.

17. The RF switch module of claim 14, wherein the first and second displays are capable of showing both increases and decreases in power level.

18. The RF switch module of claim 14, wherein the module uses one reference value relative to which both the power level information of the first amplifier and the power level information of the second amplifier are displayed.

19. An RF switch module comprising:
a module housing;
a first input connector provided at the module housing;
a second input connector provided at the module housing;
an output connector provided at the module housing;
a switch arrangement positioned within the housing, the switch arrangement being connected to the first and second input connectors by circuitry, the switch arrangement being switchable between a first configuration where first input connector is electrically connected to the output connector and a second configuration where the second input connector is electrically connected to the output connector;
a display arrangement that visually shows the relative strength of a first signal input through the first input connector as compared to a second signal input through the second input connector; and
a controller positioned within the module housing and sampling circuitry for sampling the first and second signals, wherein the sampling circuitry provides signal power level data to the controller, wherein the controller interfaces with the display arrangement and uses the signal power level data to control the information displayed by the display arrangement;
wherein the display arrangement includes first and second displays for displaying power levels of the first and second signals, and wherein the controller uses signal power level data from the first signal to set a reference power level value for both the first and second displays.

20. The RF switch module of claim 19, wherein the first and second displays are capable of showing both increases and decreases in power level relative to the reference power level value.

21. An RF switch module comprising:
- a module housing;
- a first input connector provided at the module housing;
- a second input connector provided at the module housing;
- an output connector provided at the module housing;
- a switch arrangement positioned within the housing, the switch arrangement being connected to the first and second input connectors by circuitry, the switch arrangement being switchable between a first configuration where first input connector is electrically connected to the output connector and a second configuration where the second input connector is electrically connected to the output connector; and
- a display arrangement that visually shows the relative strength of a first signal input through the first input connector as compared to a second signal input through the second input connector, wherein the display arrangement includes first and second displays for displaying power levels of the first and second signals, and wherein a signal power level data from the first signal is used to set a reference power level value for both the first and second displays.

22. The RF switch module of claim 21, further comprising a controller positioned within the module housing and sampling circuitry for sampling the first and second signals, wherein the sampling circuitry provides the signal power level data to the controller, wherein the controller interfaces with the display arrangement and uses the signal power level data to control the information displayed by the display arrangement.

23. The RF switch module of claim 21, wherein the first and second displays are capable of showing both increases and decreases in power level relative to the reference power level value.

* * * * *